United States Patent [19]

Smith

[11] 4,394,403
[45] Jul. 19, 1983

[54] PHOTOPOLYMERIZABLE COMPOSITIONS

[75] Inventor: George H. Smith, Maplewood, Minn.

[73] Assignee: Minnesota Mining and Manufacturing Company, St. Paul, Minn.

[21] Appl. No.: 564,421

[22] Filed: Apr. 2, 1975

Related U.S. Application Data

[63] Continuation-in-part of Ser. No. 467,899, May 8, 1974, abandoned.

[51] Int. Cl.$^3$ ............... G03C 1/68; C08F 8/18; B05D 3/06
[52] U.S. Cl. ............... 427/42; 204/159.18; 204/159.24; 260/440; 260/446; 427/35; 427/43.1; 548/102; 548/107; 549/3; 549/26; 549/43; 549/44; 549/207; 549/212; 549/458; 430/280; 430/270
[58] Field of Search ............ 430/280, 270; 427/35, 427/42, 43; 428/413; 96/115 P, 115 R; 204/159.18, 159.23, 159.24; 260/440, 446, 606.5 F, 346 H; 548/107, 102; 549/3, 26, 43, 44, 207, 212, 458; 568/8, 17

[56] References Cited

U.S. PATENT DOCUMENTS

| | | | |
|---|---|---|---|
| 3,074,869 | 1/1963 | Workman | 204/158 |
| 3,205,157 | 9/1965 | Lacari et al. | 204/158 |
| 3,373,221 | 3/1968 | May | 96/2 EP |
| 3,567,453 | 3/1971 | Borden | 96/115 R |
| 3,691,133 | 9/1972 | Sura | 360/2 EC |
| 3,711,390 | 1/1973 | Feinberg | 96/115 P |
| 3,729,313 | 3/1973 | Smith | 96/114 P |
| 3,801,583 | 4/1974 | Morishita et al. | 96/115 P |
| 3,808,006 | 4/1974 | Smith | 96/115 P |
| 3,816,280 | 6/1974 | Watt | 96/115 P |
| 3,826,650 | 7/1974 | Schlesinger | 204/159.23 |

FOREIGN PATENT DOCUMENTS

| | | |
|---|---|---|
| 1071652 | 6/1967 | United Kingdom . |
| 1111232 | 4/1968 | United Kingdom . |

OTHER PUBLICATIONS

Irving et al., Journal of Chemical Society (1960), pp. 2078-2081.
Banks, Chemical Review, vol. 66, No. 3, May 25, 1966, pp. 243-263.

*Primary Examiner*—Jack P. Brammer
*Attorney, Agent, or Firm*—Cruzan Alexander; Donald M. Sell; David R. Cleveland

[57] ABSTRACT

Photopolymerizable compositions which comprise cationically polymerizable organic material and photosensitive aromatic iodonium salt of a halogen-containing complex ion are described as are coated substrates and methods for bonding materials together using such compositions.

41 Claims, No Drawings

PHOTOPOLYMERIZABLE COMPOSITIONS

This application is a continuation-in-part of my copending application Ser. No. 467,899, filed May 8, 1974, now abandoned.

BACKGROUND OF THE INVENTION

1. Field of the Invention:

This invention relates to photopolymerizable compositions. More particularly, this invention relates to compositions which comprise an organic, cationically polymerizable material and an aromatic iodonium complex salt as photoinitiator and which can be cured by exposure to actinic radiation or electron beam irradiation.

2. Description of the Prior Art:

Although photopolymerizable epoxy compositions comprising epoxy resin materials and photosensitizers have been desired for some time, those which have previously been proposed suffer from one or more drawbacks. Thus, in U.S. Pat. No. 3,074,869 there are disclosed photosensitive epoxy compositions containing a nitrosoamine as photosensitizer. Compositions of this type require relatively long exposure to a high intensity light source to produce complete polymerization.

In U.S. Pat. Nos. 3,205,157 and 3,708,296, there are disclosed photosensitive epoxy compositions containing respectively aryldiazonium salts and aryldiazonium salts of halogen-containing complex anions. Such compositions have limited usefulness because they have poor thermal stability, because their spectral response is limited to the ultraviolet region of the spectrum, and because nitrogen is evolved during photopolymerization causing pinholes and bubbles in heavy coatings of the composition.

When these known aryldiazonium salts are used to induce polymerization of oxetanes, or mixtures of oxetanes with epoxy resins, e.g., as described in U.S. Pat. No. 3,835,003, the same types of problems are encountered. Although several patents describe various techniques for stabilizing mixtures of diazonium salts and epoxides, such techniques are not satisfactory for several reasons. For example, the increase in stability which is obtained is measured only in days. Also, the addition of stabilizers contaminates the compositions with nonreactive material which softens the resulting product and also reduces the rate of photocure. See, e.g., U.S. Pat. Nos. 3,711,390; 3,711,931; 3,816,278; 3,816,280; 3,816,281; 3,817,850; and 3,817,845.

In U.S. Pat. No. 3,450,613 there is described another photopolymerizable epoxy composition comprising the reaction product of an epoxy resin prepolymer and an ethylenically unsaturated organic acid, a photosensitizer, and optionally polyfunctional acids or bases. This composition on exposure to ultraviolet light gels by reason of the photoinduced polymerization of the ethylenically unsaturated portion of the reaction product. Completion of the cure of the composition is effected by heating to bring about reaction of the epoxy resin portion of the composition. Such compositions as this have limited usefulness because of the requirement of both light and heat to effect complete polymerization of the composition. The composition furthermore is oxygen sensitive and has poor thermal stability.

The present invention provides novel photopolymerizable compositions, comprising cationically polymerizable materials and a photoinitiator, which are sensitive throughout the ultraviolet and visible spectral regions, i.e., wavelengths from about 300 to 700 millimicrons, and which may be photocured by exposure for relatively short periods of time to radiation within this range of wavelengths or by exposure to electron beam irradiation. The invention also provides novel complex salt photoinitiators.

SUMMARY OF THE INVENTION

In accordance with the present invention there are provided photopolymerizable compositions which are readily photocured by exposure to actinic radiation or electron beam comprising an organic material which is cationically polymerizable and certain photosensitive aromatic iodonium complex salts as photoinitiator and, optionally, a sensitizer for said photoinitiator. The photopolymerizable compositions of the invention are sensitive throughout the ultraviolet and visible spectral regions and photocure rapidly, without use of heat, to polymers having desirable properties. For example, the epoxy compositions cure to polymers which possess inherent superior toughness; abrasion resistance; adhesion to metal, glass, plastic, wood and other surfaces; and resistance to chemical attack. The compositions of the invention are one-part, stable compositions having very good shelf life and good thermal stability. Consequently, the compositions can be used under conditions of high temperature. Mixtures of oxetanes, vinyl ethers or lactones with epoxy-containing materials make photopolymerizable compositions having very desirable properties which can be varied, as desired, to fit any particular application.

DETAILED DESCRIPTION OF THE INVENTION

The aromatic iodonium complex salt photoinitiator suitable for use in the compositions of the invention can be defined by the formula

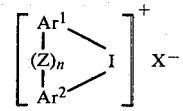

wherein $Ar^1$ and $Ar^2$ are the same or different aromatic groups having 4 to 20 carbon atoms and are selected from the group consisting of phenyl, thienyl, furanyl, and pyrazolyl groups; Z is selected from the group consisting of an oxygen atom; a sulfur atom;

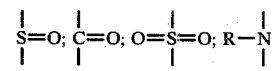

where R is hydrogen, lower alkyl or acyl (such as acetyl, benzoyl, etc.); a carbon-to-carbon bond; or

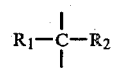

where $R_1$ and $R_2$ are selected from the group consisting of hydrogen, an alkyl radical having 1 to 4 carbon atoms, and an alkenyl radical having 2 to 4 carbon atoms; and n is zero or 1; and $X^-$ is a halogen-containing complex anion selected from the group consisting of tetrafluoroborate, hexafluorophosphate, hexafluoroarsenate, hexachloroantimonate, and hexafluoroantimonate.

The aromatic iodonium cations are stable and are well known and recognized in the art. See for example, U.S. Pat. Nos. 3,565,906; 3,712,920; 3,759,989; and 3,763,187; F. Beringer, et al., Diaryliodonium Salts IX, J. Am. Chem. Soc. 81, 342–51 (1959) and F. Beringer, et al., Diaryliodonium Salts XXIII, J. Chem. Soc. 1964, 442–51; F. Beringer, et al., Iodonium Salts Containing Heterocyclic Iodine, J. Org. Chem. 30, 1141–8 (1965).

Representative $Ar^1$ and $Ar^2$ groups are aromatic groups having 4 to 20 carbon atoms selected from phenyl, thienyl, furanyl, and pyrazolyl groups. These aromatic groups may optionally have one or more fused benzo rings (e.g., naphthyl and the like; benzothienyl, dibenzothienyl; benzofuranyl, dibenzofuranyl; etc.). Such aromatic groups may also be substituted, if desired, by one or more of the following groups: halogen, nitro, hydroxyl, carboxyl, anilino or N-alkylanilino groups, ester groups (e.g., alkoxycarboxyl such as methoxycarbonyl and ethoxycarbonyl, phenoxycarbonyl), sulfo ester groups (e.g., alkoxysulfonyl such as methoxysulfonyl and butoxysulfonyl, phenoxysulfonyl, and the like), amido groups (e.g., acetamido, butyramido, ethylsulfonamido, and the like), carbamyl groups (e.g., carbamyl, N-alkylcarbamyl, N-phenylcarbamyl, and the like), sulfamyl groups (e.g., sulfamyl, N-alkylsulamyl, N,N-dialkylsulfamyl, N-phenylsulfamyl, and the like), alkoxy groups (e.g., methoxy, ethoxy, butoxy, and the like), aryl groups (e.g., phenyl), alkyl groups (e.g., methyl, ethyl, butyl, and the like), aryloxy groups (e.g., phenoxy), alkylsulfonyl (e.g., methylsulfonyl, ethylsulfonyl, and the like), arylsulfonyl groups (e.g., phenylsulfonyl groups), perfluoroalkyl groups (e.g., trifluoromethyl, perfluoroethyl, and the like), and perfluoroalkylsulfonyl groups (e.g., trifluoromethylsulfonyl, perfluorobutylsulfonyl, and the like).

Suitable examples of the aromatic iodonium complex salt photoinitiators include:
diphenyliodonium tetrafluoroborate
di(4-methylphenyl)iodonium tetrafluoroborate
phenyl-4-methylphenyliodonium tetrafluoroborate
di(4-heptylphenyl)iodonium tetrafluoroborate
di(3-nitrophenyl)iodonium hexafluorophosphate
di(4-chlorophenyl)iodonium hexafluorophosphate
di(naphthyl)iodonium tetrafluoroborate
di(4-trifluoromethylphenyl)iodonium tetrafluoroborate
diphenyliodonium hexafluorophosphate
di(4-methylphenyl)iodonium hexafluorophosphate
diphenyliodonium hexafluoroarsenate
di(4-phenoxyphenyl)iodonium tetrafluoroborate
phenyl-2-thienyliodonium hexafluorophosphate
3,5-dimethylpyrazolyl-4-phenyliodonium hexafluorophosphate
diphenyliodonium hexachloroantimonate
diphenyliodonium hexafluoroantimonate
2,2'-diphenyliodonium tetrafluoroborate
di(2,4-dichlorophenyl)iodonium hexafluorophosphate
di(4-bromophenyl)iodonium hexafluorophosphate
di(4-methoxyphenyl)iodonium hexafluorophosphate
di(3-carboxyphenyl)iodonium hexafluorophosphate
di(3-methoxycarbonylphenyl)iodonium hexafluorophosphate
di(3-methoxysulfonylphenyl)iodonium hexafluorophosphate
di(4-acetamidophenyl)iodonium hexafluorophosphate
di(2-benzothienyl)iodonium hexafluorophosphate Of the aromatic iodonium complex salts which are suitable for use in the compositions of the invention the preferred salts are the diaryliodonium hexafluorophosphate such as diphenyliodonium hexafluorophosphate. These salts are preferred because, in general, they are more thermally stable, promote faster reaction, and are more soluble in inert organic solvents than are other aromatic iodonium salts of complex ions.

The aromatic iodonium complex salts may be prepared by methathesis of corresponding aromatic iodonium simple salts (such as, for example, the diphenyliodonium bisulfate) in accordance with the teachings of Beringer, et al., J. Am. Chem. Soc. 81, 342 (1959). Thus, for example, the complex salt diphenyliodonium tetrafluoroborate is prepared by the addition at 60° C. of an aqueous solution containing 29.2 g. (150 millimoles) silver fluoroborate, 2 g. fluoroboric acid, and 0.5 g. phosphorous acid in about 30 ml. of water to a solution of 44 g. (139 millimoles) of diphenyliodonium chloride. The silver halide that precipitates is filtered off and the filtrate concentrated to yield diphenyliodonium fluoroborate which may be purified by recrystallization.

The aromatic iodonium simple salts may be prepared in accordance with Beringer et al., above, by various methods including (1) coupling of two aromatic compounds with iodyl sulfate in sulfuric acid, (2) coupling of two aromatic compounds with an iodate in acetic acid-acetic anhydride-sulfuric acid, (3) coupling of two aromatic compounds with an iodine acylate in the presence of an acid, and (4) condensation of an iodoso compounds, an iodoso diacetate, or an iodoxy compound with another aromatic compound in the presence of an acid. Diphenyliodonium bisulfate is prepared by method (3), for example, by the addition over a period of eight hours at below 5° C. of a mixture of 35 ml. of conc. sulfuric acid and 50 ml. of acetic anhydride to a well-stirred mixture of 55.5 ml. of benzene, 50 ml. of acetic anhydride, and 53.5 g. of potassium iodate. The mixture is stirred for an additional four hours at 0°–5° C. and at room temperature for 48 hours and treated with 300 ml. of diethyl ether. On concentrating, crude diphenyliodonium bisulfate precipitates. If desired, it may be purified by recrystallization.

Epoxy-containing material useful in the compositions of the invention are any organic compounds having an oxirane ring polymerizable by ring opening. Such materials, broadly called epoxides, include monomeric epoxy compounds and epoxides of the polymeric type and can be aliphatic, cycloaliphatic, aromatic or heterocyclic. These materials generally have at least one polymerizable epoxy group per molecule (preferably two or more epoxy groups per molecule) and, in the polymeric type there are many pendent epoxy groups (e.g., a glycidyl methacrylate polymer could have several thousand pendent epoxy groups per average molecular weight).

These epoxy-containing materials may vary from low molecular weight monomeric materials to high molecular weight polymers and may vary greatly in the nature of their backbone and substituent groups. For example, the backbone may be of any type and substituent groups thereon can be any group not having an active hydrogen atom which is reactive with an oxirane ring. Illustrative of permissible substituent groups include halogens, ester groups, ethers, sulfonate groups, siloxane groups, nitro groups, amide groups, nitrile groups, phosphate groups, etc. The molecular weight of the epoxy-containing materials may vary from 58 to about 100,000 or more. Mixtures of various epoxy-containing materials can also be used in the compositions of this invention.

Such epoxy-containing materials are well known and include such epoxides as epichlorohydrins, e.g., epichlorohydrin; alkylene oxides, e.g., propylene oxide, styrene oxide; alkenyl oxides, e.g., butadiene oxide; glycidyl esters, e.g., ethyl glycidate; glycidyl-type epoxy resins, e.g., the diglycidyl ethers of Bisphenol A and of novolak resins, such as described in "Handbook of Epoxy Resins" by Lee and Neville, McGraw-Hill Book Co., New York (1967).

Other useful epoxy-containing materials which can be used in this invention are those which contain one or more cyclohexene oxide groups such as the epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. For a more detailed list of useful epoxides of this nature, reference is made to the U.S. Pat. No. 3,117,099, incorporated herein by reference.

Further epoxy-containing materials which are particularly useful in the practice of this invention include glycidyl ether monomers of the formula

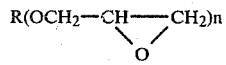

where R is alkyl or aryl and n is an integer of 1 to 6. Examples are the glycidyl ethers of polyhydric phenols obtained by reacting a polyhydric phenol with an excess of chlorohydrin such as epichlorohydrin (e.g., the diglycidyl ether of 2,2-bis-(2,3-epoxy propoxyphenol)-propane). Further examples of epoxides of this type which can be used in the practice of this invention are described in U.S. Pat. No. 3,018,262, incorporated herein by reference.

There are a host of commercially available epoxy-containing materials which can be used in this invention. In particular, epoxides which are readily available include propylene oxide, epichlorohydrin, styrene oxide, vinyl cyclohexene oxide, glycidol, glycidylmethacrylate, diglycidyl ether of Bisphenol A (e.g., those available under the trade designations "Epon 828" from Shell Chemical Co., "DER-331", "DER-332", and DER-334", from Dow Chemical Co.), vinylcyclohexene dioxide (e.g., "ERL-4206" from Union Carbide Corp.), 3,4-epoxycyclohexylmethyl-3,4-epoxycyclohexene carboxylate (e.g., "ERL-4221" from Union Carbide Corp.), 3,4-epoxy-6-methylcyclohexylmethyl-3,4-epoxy-6-methylcyclohexene carboxylate (e.g., "ERL-4201" from Union Carbide Corp.), bis(3,4-epoxy-6-methylcyclohexylmethyl) adipate (e.g., "ERL-4289" from Union Carbide Corp.), bis(2,3-epoxy-cyclopentyl) ether (e.g., "ERL-0400" from Union Carbide Corp.), aliphatic epoxy modified with polypropylene glycol (e.g., "ERL-4050" and "ERL-4052" from Union Carbide Corp.), dipentene dioxide (e.g., "ERL-4269" from Union Carbide Corp.), epoxidized polybutadiene (e.g., "Oxiron 2001" from FMC Corp.), silicone resin containing epoxy functionality, flame retardant epoxy resins (e.g., "DER-580", a brominated bisphenol type epoxy resin available from Dow Chemical Co.), 1,4-butanediol diglycidyl ether (e.g., "Araldite RD-2" from Ciba-Geigy), polyglycidyl ether of phenolformaldehyde novolak (e.g., "DEN-431" and "DEN-438" from Dow Chemical Co.), and resorcinol diglycidyl ether (e.g., "Kopoxite" from Koppers Company, Inc.).

Still other epoxy-containing materials are copolymers of acrylic acid esters of glycidol such as glycidylacrylate and glycidylmethacrylate with one or more copolymerizable vinyl compounds. Examples of such copolymers are 1:1 styrene-glycidylmethacrylate, 1:1 methylmethacrylate-glycidylacrylate and a 62.5:24:13.5 methylmethacrylate-ethyl acrylate-glycidylmethacrylate.

Still other epoxy-containing materials are the polyurethane polyepoxides which are obtained by reacting an organic polyisocyanate with a triol or a mixture of a triol and diol to form an isocyanate-terminated polyurethane prepolymer and reacting the prepolymer with a hydroxy aliphatic epoxide compound. Further examples of epoxy-containing material of this type which can be used in the practice of this invention are described in U.S. Pat. No. 3,445,436, incorporated herein by reference.

Other organic materials which can be cationically polymerized in accordance with this invention include well known classes of cationically polymerizable materials such as oxetanes, alkylvinyl ethers, lactones, and the like. The useful oxetanes include those represented by the formula

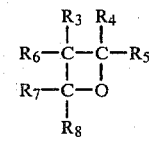

where $R_3$, $R_4$, $R_5$, $R_6$, $R_7$, and $R_8$ are selected from the group consisting of hydrogen, alkyl, haloalkyl, alkoxy, aryloxy, aryl, or acyloxy, where halogen substituents are preferably chloro, fluoro, bromo, and iodo. The useful alkylvinyl ethers include those represented by the formula $(H_2C=CH-O)_n-R$ where n is an integer of 1 to 4 and R is alkyl, aralkyl, or other organic material (whether polymeric or a simple low molecular weight radical) which is free of basic groups (such as primary or secondary amino groups) which are more basic than triphenylamine. Useful lactones are those well known in the art.

Useful photopolymerizable compositions of this invention also include mixtures of two or more organic materials capable of cationic polymerization in combination with an aromatic iodonium complex salt photoinitiator. For example, it may be desirable to adjust the viscosity, coatability, or final cured properties of a photopolymerizable epoxy composition by including therein some amount of an oxetane, alkylvinyl ether or lactone, and vice-versa.

The photopolymerizable compositions of the invention can be used as adhesives, caulking and sealing compounds, casting and molding compounds, potting and encapsulating compounds, impregnating and coating compounds, etc., depending on the particular organic material and aromatic iodonium complex salt used. The photopolymerizable composition can be used as a one-component cured-in-place composition.

If desired, one may include in the photopolymerizable compositions various conventional non-basic fillers (e.g., silica, talc, glass bubbles, clays, powdered metal such as aluminum, zinc oxide, etc.) up to about 50% by volume or more, viscosity modifiers, plasticizers, anhydrides, rubbers, tackifying agents, pigments, and so forth.

The photopolymerizable compositions are particularly suitable in a variety of applications in the field of graphic arts due to their superior abrasion-resistance and adhesion to rigid, resilient and flexible substrates such as metal, plastic, rubber, glass, paper, wood, and ceramics; their excellent resistance to most solvents and chemicals; and their capability of forming high resolution images. Among such uses are in making acid- and alkali-resist images for chemical milling, gravure images, offset plates, flexographic printing, screenless lithography, printing plates, stencil making, microimages for printed circuitry, microimages for information storage, decorations of paper, glass, and metal surfaces, and light-cured coatings. The compositions may also be used to impregnate substrates such as glass cloth and the like to obtain a shelf-stable product which is useful in many manufacturing and repairing processes where a curable liquid composition is not convenient to use.

The photopolymerization of the compositions of the invention occurs on exposure of the compositions to any source of radiation emitting actinic radiation at a wavelength within the ultraviolet and visible spectral regions. Suitable sources of radiation include mercury, xenon, carbon arc and tungsten filament lamps, sunlight, etc. Exposures may be from less than about 1 second to 10 minutes or more depending upon the amounts and particular epoxy materials and aromatic iodonium complex salts being utilized and depending upon the radiation source and distance from the source and the thickness of the coating to be cured. The compositions may also be polymerized by exposure to electron beam irradiation. Generally speaking the dosage necessary is from less than 1 megarad to 100 megarad or more. One of the major advantages with using electron beam curing is that highly pigmented compositions can be effectively cured at a faster rate than by mere exposure to actinic radiation.

While not desiring to be bound by theory, the photopolymerization apparently takes place by reason of the photo-induced degradation of the aromatic iodonium complex salt with the production of a Lewis acid which catalyzes the polymerization of the organic material. The curing is a triggered reaction, i.e., once the degradation of the aromatic iodonium complex salt has been initiated by exposure to a radiation source, the curing reaction proceeds and will continue even after the radiation source is removed. The use of thermal energy during or after exposure to a radiation source will greatly accelerate the curing reaction.

The aromatic iodonium complex salts useful in the photopolymerizable compositions of the invention are of themselves photosensitive only in the ultraviolet. They, however, are sensitized to the near ultraviolet and the visible range of the spectrum by sensitizers for known photolyzable organic halogen compounds in accordance with the teachings of U.S. Pat. No. 3,729,313 which is incorporated herein by reference. Illustrative sensitizers are found in the following categories: aromatic amines, aminoketones, and colored aromatic polycyclic hydrocarbons. The use of basic amino compounds is avoided since such compounds tend to slow the polymerization of the organic material by reacting with the Lewis acid generated by the photoinitiator.

The amount of aromatic iodonium complex salt that may be employed in the compositions of the invention is from about 0.5 to 30 parts per 100 parts of organic material and preferably from about 1 to 7 parts per 100 parts of organic material. For those compositions wherein a sensitizer is used to make the composition sensitive to radiation in the visible range, about 0.01 to 1.0 parts and preferably about 0.1 to 1.0 parts by weight of sensitizer per part of aromatic iodonium complex salt may be employed.

The photopolymerizable compositions of the invention are prepared by simply admixing, under "safe light" conditions, the aromatic iodonium complex salt and the sensitizer, when used, with the organic material. Suitable inert solvents may be employed if desired when effecting this mixture. Examples of suitable solvents are acetone, acetonitrile, methanol and includes any solvent which does not react appreciably with the organic material, the aromatic iodonium complex salt or the sensitizer. A liquid organic material to be polymerized may be used as a solvent for another liquid or solid organic material to be polymerized. A solvent, however, is generally used only to aid in providing a suitable viscosity to the composition for purposes of coating. Solventless compositions can be prepared by simply dissolving the aromatic iodonium complex salt and sensitizer in the organic material with or without the use of mild heating.

In the following examples which will serve to illustrate the present invention, all parts are parts by weight and all percentages are given as percentages by weight, unless otherwise indicated.

EXAMPLES 1–6

In separate examples the various amounts of diphenyliodonium hexafluorophosphate (designated $\phi_2IPF_6$) shown in Table I were added to 5 parts of "DER-331" (a diglycidyl ether of Bisphenol A available from Dow Chemical Co. having an epoxy equivalency of about 190) and well mixed at about 50° C. Each portion was then wire rod coated at 2.3 mils (0.006 cm.) thick onto a 2 mil (0.005 cm.) polyester film. Samples of the coating were then exposed to a 275 watt General Electric RS sunlamp at a distance of 5 inches (12.7 cm.). The time required for the surface of the coating to become tack-free is listed in Table I.

TABLE I

| | Example | | | | | |
|---|---|---|---|---|---|---|
| | 1 | 2 | 3 | 4 | 5 | 6 |
| $\phi_2IPF_6$ (Parts) | 0.05 | 0.10 | 0.15 | 0.20 | 0.25 | 0.30 |
| Tack-Free (Seconds) | 120 | 90 | 80 | 60 | 25 | 25 |

It may be observed by inspection of Table I that the time required for the epoxy composition to become tack-free decreases from 120 seconds at 1% concentration of diaryliodonium complex salt to 25 seconds at 5% of the salt. Increase of the salt concentration to 6% does not further decrease the tack time because at 6%, the solubility of the salt in "DER-331" has been exceeded.

EXAMPLES 7–16

In separate examples, coating were prepared as in Examples 1–6 from photopolymerizable compositions containing the various epoxy materials and the various amounts of the various aromatic iodonium complex salts shown in Table II, the coatings then being exposed to a General Electric sunlamp at 5 inches (12.7 cm.) or to a General Electric "H3T7" mercury lamp at 7 inches (17.8 cm.). The time required for the surface of the coating to become tack-free is also reported in Table II.

TABLE II

| Example | Epoxy Material | Iodonium Complex Salt | Parts By Weight Complex Salt | Exposure Unit | Tack-Free Cure (Sec.) |
|---|---|---|---|---|---|
| 7 | "DER-334" | $\phi_2 IPF_6$[a] | 6 | Sunlamp | 25 |
| 8 | "DER-334" | $\phi_2 IBF_4$[b] | 6 | H3T7 | 60 |
| 9 | "DER-334" | $\phi_2 IBF_4$ | 4 | H3T7 | 90 |
| 10 | "DER-334" | $\phi_2 IPF_6$ | 2 | H3T7 | 60 |
| 11 | "ERL-4221" | $\phi_2 IPF_6$ | 4 | H3T7 | 90 |
| 12 | "ERL-4221" | $\phi_2 IBF_4$ | 4 | H3T7 | 180 |
| 13 | Phenyl Glycidyl Ether | $\phi_2 IPF_6$ | 4 | H3T7 | 180 |
| 14 | "Epon-828" | $\phi_2 ISbF_6$[c] | 2 | H3T7 | 60 |
| 15 | "DER-331" | $(CH_3-\phi)_2 IPF_6$[d] | 6 | Sunlamp | 40 |
| 16 | "Epon-828" | $\phi_2 ISbF_6$ | 5 | Sunlamp | 10 |

[a]diphenyliodonium hexafluorophosphate
[b]diphenyliodonium tetrafluoroborate
[c]diphenyliodonium hexafluoroantimonate
[d]ditolyliodonium hexafluorophosphate

EXAMPLES 17-23

Photopolymerizable compositions were prepared and coated as described in Examples 1-6 using the epoxy-containing materials, aromatic iodonium complex salt, and sensitizing dye (wt. % based on wt. of complex salt) shown in Table III. The time required for the surface of the coating of each composition to become tack-free is presented in Table III.

EXAMPLE 24

Solution of 20 grams "DER-331", 1.0 gram diphenyliodonium hexafluorophosphate, and 0.1 gram 2-ethyl-9,10-dimethoxyanthracene was coated at 30.0 mils (0.076 cm.) thick on 2 mil (0.005 cm.) thick polyester film. After exposure of the coated film for 5 minutes at 5 inches (12.7 cm.) from a General Electric sunlamp, a hard cured sample was obtained, the coating being firmly bonded to the film. The cured sample was completely transparent and contained no bubbles. Unexposed portions of the coating can be washed away with acetone leaving a sharp, clearly defined image area.

EXAMPLE 25

A solution was prepared containing 5 grams of a 5% solution of a 1:1 styrene-glycidylmethacrylate copolymer in acetone, 0.01 gram of diphenyliodonium hexafluorophosphate, and 0.005 gram 2-ethyl-9,10-dimethoxyanthracene. It was coated on 2 mil (0.005 cm.) thick polyester film at a wet thickness of 2.3 mils (0.006 cm.) and air dried. A sample was exposed to a General Electric H3T7 lamp at 7 inches (17.8 cm.) distance through a $\sqrt{2}$ photographic step tablet for 3 minutes and dipped in acetone to remove the unexposed areas. Seven steps of polymerized material remained.

EXAMPLE 26

As another example of the utility of the compositions described herein a photopolymerizable varnish is prepared which is useful for coating fishing rod windings. The composition is prepared with the following ingredients:

|  | Parts |
|---|---|
| "DER-334" (a diglycidyl ether of Bisphenol A) | 100 |
| Phenyl glycidyl ether | 10 |
| Diphenyliodonium hexafluorophosphate | 2 |
| 2-Ethyl-9,10-dimethoxyanthracene | 0.1 |

The "DER-334" and phenyl glycidyl ether are mixed

TABLE III

| Example | Epoxy Material | Complex Salt | Parts | (Wt. % Based on Wt. of Complex Salt) | Exposure Unit | Tack-Free Cure (Sec.) |
|---|---|---|---|---|---|---|
| 17 | "DER-331"[a] | $(CH_3-\phi)_2 IPF_6$ | (6) | 2-Ethyl-9,10-dimethoxyanthracene | (10) Sunlamp | 10 |
| 18 | "DER-331"[a] | $(CH_3-\phi)_2 IPF_6$ | (6) | Triphenylamine | (10) Sunlamp | 30 |
| 19 | "DER-331"[a] | $\phi_2 IPF_6$ | (5) | 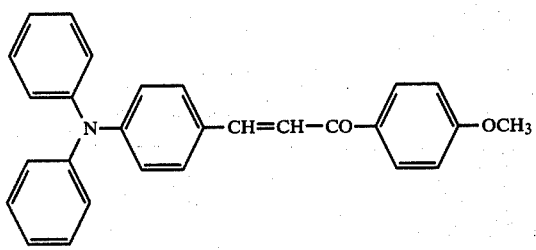 | (10) Sunlamp | 10 |
| 20 | "DER-331"[a] | $\phi_2 IPF_6$ | (5) | 5,10-Diethoxy-16,17-dimethoxyviolanthrene | (10) H3T7 | 10 |
| 21 | "DER-331"[a] | $\phi_2 IPF_6$ | (5) | Perylene | (10) H3T7 | 10 |
| 22 | "Epon 826"[b] | $\phi_2 ISbF_6$ | (5) | 2-Ethyl-9,10-dimethoxyanthracene | (9) Sunlamp | 5 |
| 23 | "Epon 826"[b] | $\phi_2 ISbF_6$ | (5) | Same as for Ex. 19 | (8) Sunlamp | 8 |

[a]Diglycidyl ether of Bisphenol A having epoxy equivalency of about 190.
[b]A low viscosity glycidyl ether of Bisphenol A with epoxyequivalency of about 185.

with gentle heating while the diphenyl iodonium complex salt and sensitizer are added thereto with stirring. A clear photopolymerizable solution is obtained.

The photopolymerizable solution is coated onto the nylon thread windings of a fishing rod guide. The thread had been previously heated to about 50° C. so that the solution would saturate rapidly into the windings when applied thereto with a brush. The impregnated windings are then exposed to a 275 watt sunlamp at a distance of about 7.5 centimeters for about two minutes, the fishing rod being rotated slowly during exposure. After exposure in the manner described a second application of photopolymerizable solution to the windings is made, followed by exposure to a sunlamp to cure the coating. A smooth, varnished winding with high gloss and durability is obtained.

This technique for coating windings on fishing rods is much faster and simpler than with conventional techniques wherein solvent-based lacquers and varnishes are used.

EXAMPLES 27-33

Various organic materials (in an amount of 3 grams) were added separately to separate solutions containing diphenyliodonium hexafluorophosphate (0.15 gram) and 2-ethyl-9,10-dimethoxyanthracene (0.02 gram) in 1-2 grams of methylene chloride. The resulting solutions, in separate vials, were each exposed to a General Electric sunlamp (275 watts) at a distance of 5 inches. The following results were obtained:

| Example No. | Organic Material | Exposure Time | Result |
|---|---|---|---|
| 27 | HO(CH$_2$)$_4$OCH=CH$_2$ | 15 seconds | gellation* |
| 28 | diethyleneglycoldivinyl ether | 5 seconds | vigorous exothermic polymerization |
| 29 | chloroethylvinyl ether | 30 seconds | gellation* |
| 30 | 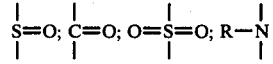 | 60 seconds | insoluble skin of polymer formed |
| 31 | 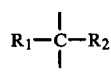 | 90 seconds | solid polymer formation |
| 32 | γ-valerolactone | 120 seconds | polymer formation |
| 33 | caprolactone | 120 seconds | polymer formation |

*Upon standing, solid polymers were formed in less than 24 hours.

EXAMPLES 34-35

Two solutions were prepared containing the following ingredients in the parts by weight shown:

| Ingredients | Example 34 | Example 35 |
|---|---|---|
| Epoxy resin ("DER-331") | 5.0 | 5.0 |
| acetone | 2.0 | 2.0 |
| diphenyliodonium hexafluorophosphate | — | 0.25 |

The two solutions were coated on separate samples of polyester film using a #10 wire rod and then dried to leave a tacky coating 0.7 mil (17 microns) thick. Each sample was exposed to electron beam apparatus of 100 kilovolts and 2.5 milliamps at a distance of 0.75 inch. A 10 megarad dosage did not cause any noticeable effect in Example 34, but a 3 megarad dosage was sufficient to cure the composition of Example 35 to a tack-free state.

What is claimed is:

1. A photopolymerizable composition comprising:
   (a) an organic material which is cationically polymerizable; and
   (b) about 0.5 to 30 parts by weight, per 100 parts by weight of said organic material, of an aromatic iodonium complex salt photoinitiator of the formula

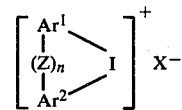

wherein Ar$^1$ and Ar$^2$ are aromatic groups having 4 to 20 carbon atoms and are selected from the group consisting of phenyl, thienyl, furanyl, and pyrazolyl groups; Z is selected from the group consisting of an oxygen atom; a sulfur atom;

$$S=O; \ C=O; \ O=S=O; \ R-N$$

where R is hydrogen, lower alkyl or acyl; a carbon-to-carbon bond; or $$R_1-C-R_2$$

where R$_1$ and R$_2$ are selected from the group consisting of hydrogen, an alkyl radical having 1 to 4 carbon atoms, and an alkenyl radical having 2 to 4 carbon atoms; and n is zero or 1; and X$^-$ is a halogen-containing complex anion selected from the group consisting of tetrafluoroborate, hexafluorophosphate, hexafluoroarsenate, hexachloroantimonate, and hexafluoroantimonate.

2. A photopolymerizable composition in accordance with claim 1, wherein said organic material has an epoxy functionality of at least 1.

3. A photopolymerizable composition in accordance with claim 2, wherein said organic material is selected from the group consisting of epichlorohydrins, alkylene oxides, alkenyl oxides, glycidyl esters, glycidyl ethers, epoxy novolaks, copolymers of acrylic acid esters of glycidol and copolymerizable vinyl compounds, and polyurethane polyepoxides.

4. A photopolymerizable composition in accordance with claim 1, wherein said $Ar^1$ and $Ar^2$ are selected from the group consisting of phenyl and substituted phenyl groups.

5. A photopolymerizable composition in accordance with claim 1, wherein said $Ar^1$ and $Ar^2$ groups are selected from the group consisting of thienyl and substituted thienyl groups.

6. A photopolymerizable composition in accordance with claim 4, wherein n is zero.

7. A photopolymerizable composition in accordance with claim 4, wherein n is 1 and Z is a carbon-to-carbon bond.

8. A photopolymerizable composition in accordance with claim 5, wherein n is zero.

9. A photopolymerizable composition in accordance with claim 4, wherein $Ar^1$ and $Ar^2$ are alkylphenyl groups.

10. A photopolymerizable composition in accordance with claim 1, wherein said halogen-containing complex anion is selected from the group consisting of tetrafluoroborate, hexafluorophosphate, and hexafluoroantimonate.

11. A photopolymerizable composition in accordance with claim 1, wherein said photoinitiator is present in an amount of about 1 to 7 parts by weight per 100 parts by weight of said organic compound.

12. A photopolymerizable composition in accordance with claim 1 further containing about 0.01 to 1 part by weight of sensitizing dye per part by weight of photoinitiator.

13. A photopolymerizable composition in accordance with claim 1, wherein said organic material contains a vinyl ether group.

14. A photopolymerizable composition in accordance with claim 1, wherein said organic material contains an oxetane group.

15. A photopolymerizable composition in accordance with claim 1, wherein said organic material is a lactone.

16. A process for obtaining a cured coating comprising:
(a) supplying a thin layer of the composition of claim 1 to a substrate, and
(b) exposing said layer to actinic radiation or electron beam irradiation.

17. A substrate bearing a thin layer of the composition of claim 1 which has been cured in situ.

18. A photopolymerizable composition comprising:
(a) an organic compound having an epoxy functionality of at least 1; and
(b) about 0.5 to 30 parts by weight, per 100 parts by weight of said organic compound, of an aromatic iodonium complex salt photoinitiator of the formula

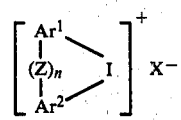

wherein $Ar^1$ and $Ar^2$ are aromatic groups having 4 to 20 carbon atoms and are selected from the group consisting of phenyl, thienyl, and furanyl groups; Z is an oxygen atom, a carbon-to-carbon bond, or

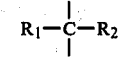

where $R_1$ and $R_2$ are selected from the group consisting of hydrogen, an alkyl radical having 1 to 4 carbon atoms, and an alkenyl radical having 2 to 4 carbon atoms, and n is zero or 1; and $X^-$ is a halogen-containing complex anion selected from the group consisting of tetrafluoroborate, hexafluorophosphate, hexafluoroarsenate, hexachloroantimonate, and hexafluoroantimonate.

19. A photopolymerizable composition in accordance with claim 18, wherein said organic material is selected from the group consisting of epichlorohydrins, alkylene oxides, alkenyl oxides, glycidyl esters, glycidyl ethers, epoxy novolaks, copolymers of acrylic acid esters of glycidol and copolymerizable vinyl compounds, and polyurethane polyepoxides.

20. A photopolymerizable composition in accordance with claim 18, wherein said organic material comprises a copolymer of acrylic acid esters of glycidol and copolymerizable vinyl compounds.

21. A photopolymerizable composition in accordance with claim 18, wherein said organic material contains one or more cyclohexene oxide groups.

22. A photopolymerizable composition in accordance with claim 21, wherein said organic material comprises epoxycyclohexanecarboxylate.

23. A photopolymerizable composition in accordance with claim 18, wherein said organic material comprises glycidyl ether of the formula

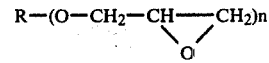

where R is alkyl or aryl and n is an integer of 1 to 6.

24. A photopolymerizable composition in accordance with claim 18, wherein said $Ar^1$ and $Ar^2$ are selected from the group consisting of phenyl and substituted phenyl groups.

25. A photopolymerizable composition in accordance with claim 18, wherein said $Ar^1$ and $Ar^2$ groups are selected from the group consisting of thienyl and substituted thienyl groups.

26. A photopolymerizable composition in accordance with claim 24, wherein n is zero.

27. A photopolymerizable composition in accordance with claim 24, wherein n is 1 and Z is a carbon-to-carbon bond.

28. A photopolymerizable composition in accordance with claim 25, wherein n is zero.

29. A photopolymerizable composition in accordance with claim 24, wherein $Ar^1$ and $Ar^2$ are alkylphenyl groups.

30. A photopolymerizable composition in accordance with claim 18, wherein said halogen-containing complex anion is selected from the group consisting of tetrafluoroborate, hexafluorophosphate, and hexafluoroantimonate.

31. A photopolymerizable composition in accordance with claim 18, wherein said photoinitiator is present in an amount of about 1 to 7 parts by weight per 100 parts by weight of said organic compound.

32. A photopolymerizable composition in accordance with claim 18, further containing about 0.01 to 1 part by weight of sensitizing dye per part by weight of photoinitiator.

33. A photopolymerizable composition comprising an admixture of:
  (a) 80 to 100 parts by weight of a diglycidyl ether of Bisphenol A,
  (b) up to 20 parts by weight of a phenyl glycidyl ether,
  (c) up to 10 parts by weight of a solvent carrier,
  (d) up to about 1 part by weight of a sensitizing dye,
  (e) 0.5 to 20 parts by weight of an aromatic iodonium complex salt photoinitiator of the formula

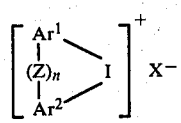

wherein $Ar^1$ and $Ar^2$ are aromatic groups having 4 to 20 carbon atoms and are selected from the group consisting of phenyl, thienyl, furanyl, and pyrazolyl groups; Z is selected from the group consisting of an oxygen atom; a sulfur atom;

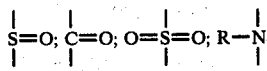

where R is hydrogen, lower alkyl or acyl; a carbon-to-carbon bond; or

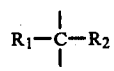

where $R_1$ and $R_2$ are selected from the group consisting of hydrogen, an alkyl radical having 1 to 4 carbon atoms; and n is zero or 1; and $X^-$ is a halogen-containing complex anion selected from the group consisting of tetrafluoroborate, hexafluorophosphate, hexafluoroarsenate, hexachloroantimonate, and hexafluoroantimonate.

34. A process for bonding a radiation-transparent substrate to a second substrate comprising:
  (a) disposing a layer of the composition of claim 1 between said substrates and in contact therewith; and
  (b) exposing said layer to actinic radiation or electron beam irradiation through said radiation-transparent substrate in an amount and for a time sufficient to render said layer insoluble.

35. An aromatic iodonium complex salt of the formula

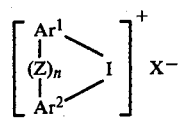

wherein $Ar^1$ and $Ar^2$ are aromatic groups having 4 to 20 carbon atoms and are selected from the group consisting of phenyl, thienyl, furanyl, and pyrazolyl groups; Z is selected from the group consisting of an oxygen atom; a sulfur atom;

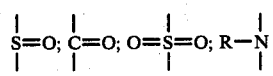

where R is hydrogen, lower alkyl or acyl; a carbon-to-carbon bond; or

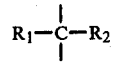

where $R_1$ and $R_2$ are selected from the group consisting of hydrogen, an alkyl radical having 1 to 4 carbon atoms, and an alkenyl radical having 2 to 4 carbon atoms; and n is zero or 1; and wherein $X^-$ is a halogen-containing complex anion selected from the group consisting of hexafluorophosphate, hexafluoroarsenate, and hexafluoroantimonate.

36. An aromatic iodonium complex salt in accordance with claim 35, wherein X is hexafluorophosphate.

37. An aromatic iodonium complex salt in accordance with claim 35, wherein X is hexafluoroantimonate.

38. An aromatic iodonium complex salt in accordance with claim 35, wherein X is hexafluoroarsenate.

39. A photopolymerizable composition in accordance with claim 1 further containing up to 50% by volume of a filler.

40. A photopolymerizable composition comprising:
  (a) a cationically polymerizable organic material having an oxirane ring polymerizable by ring opening and
  (b) about 0.5 to 30 parts by weight per 100 parts by weight of said organic material of a photo-decomposable aromatic iodonium salt of the formula

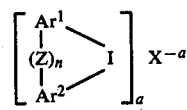

wherein $Ar^1$ and $Ar^2$ are aromatic groups having 4 to 20 carbon atoms and are selected from the group consisting of phenyl, thienyl, furanyl, pyrazolyl, chlorophenyl, nitrophenyl, methoxyphenyl and pyridyl groups; Z is selected from the group consisting of an oxygen atom; a sulfur atom;

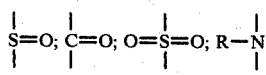

where R is hydrogen, lower alkyl or acyl; a carbon-to-carbon bond; or

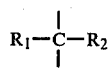

where $R_1$ and $R_2$ are selected from the group consisting of hydrogen, an alkyl radical having 1 to 4 carbon atoms, and an alkenyl radical having 2 to 4 carbon atoms; and n is zero or 1; a is 1 or 2 and X is a halogen containing complex anion selected from the group consisting of $BF_4^-$, $PF_6^-$, $AsF_6^-$, $SbF_6^-$, and $SbCl_6^-$.

41. An iodonium salt of the formula

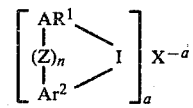

wherein $Ar^1$ and $Ar^2$ are aromatic groups having 4 to 20 carbon atoms and are selected from the group consisting of phenyl, thienyl, furanyl, pyrazolyl, chlorophenyl, nitrophenyl, methoxyphenyl and pyridyl groups; Z is selected from the group consisting of an oxygen atom; a sulfur atom;

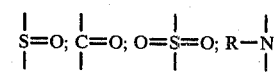

where R is hydrogen, lower alkyl or acyl; a carbon-to-carbon bond; or

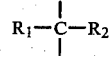

where $R_1$ and $R_2$ are selected from the group consisting of hydrogen, an alkyl radical having 2 to 4 carbon atoms; and n is zero or 1; a is 1 or 2 and X is a halogen containing complex anion selected from the group consisting of $PF_6^-$, $AsF_6^-$, $SbF_6^-$, and $SbCl_6^-$.

* * * * *

UNITED STATES PATENT AND TRADEMARK OFFICE
CERTIFICATE OF CORRECTION

PATENT NO. : 4,394,403

DATED : July 19, 1983

INVENTOR(S) : George H. Smith

It is certified that error appears in the above—identified patent and that said Letters Patent is hereby corrected as shown below:

Column 8, line 35, "$\omega_2 IPF_6$" should read -- $\phi_2 IPF_6$ --.

Column 13, line 56, "supplying" should read -- applying --.

*Signed and Sealed this*

*Twenty-eighth* Day of *February 1984*

[SEAL]

*Attest:*

GERALD J. MOSSINGHOFF

*Attesting Officer*   *Commissioner of Patents and Trademarks*